United States Patent
Bahl

[19]

[11] Patent Number: 6,072,160
[45] Date of Patent: Jun. 6, 2000

[54] METHOD AND APPARATUS FOR ENHANCING THE EFFICIENCY OF RADIANT ENERGY SOURCES USED IN RAPID THERMAL PROCESSING OF SUBSTRATES BY ENERGY REFLECTION

[75] Inventor: Suneet Bahl, Pleasanton, Calif.

[73] Assignee: Applied Materials, Inc., Santa Clara, Calif.

[21] Appl. No.: 08/659,064

[22] Filed: Jun. 3, 1996

[51] Int. Cl.[7] ............................. C23C 16/00; F21V 7/00
[52] U.S. Cl. .................... 219/405; 392/416; 250/492.22; 362/304
[58] Field of Search ...................... 392/376, 416, 392/418; 219/405, 411, 398, 399, 400, 402, 403, 390; 118/725, 50.1; 250/497.22; 362/304, 305

[56] References Cited

U.S. PATENT DOCUMENTS

| | | | |
|---|---|---|---|
| 2,057,776 | 10/1936 | Groven | 219/45 |
| 2,318,533 | 5/1943 | Selvig | 219/34 |
| 3,623,712 | 11/1971 | McNeilly et al. | 263/41 |
| 3,761,678 | 9/1973 | Eckles | 219/343 |
| 3,836,751 | 9/1974 | Anderson | 219/411 |
| 3,862,397 | 1/1975 | Anderson et al. | 219/405 |
| 3,936,686 | 2/1976 | Moore | 313/36 |
| 4,047,496 | 9/1977 | McNeilly et al. | 118/49.1 |
| 4,081,313 | 3/1978 | McNeilly et al. | 156/610 |
| 4,101,759 | 7/1978 | Anthony et al. | 219/343 |
| 4,232,360 | 11/1980 | Vakil et al. | 362/294 |
| 4,270,260 | 6/1981 | Krueger | 29/403.4 |
| 4,357,523 | 11/1982 | Bleckmann | 219/464 |
| 4,378,956 | 4/1983 | Lester | 355/3 R |
| 4,389,970 | 6/1983 | Edgerton | 118/666 |
| 4,411,619 | 10/1983 | Darnell et al. | 432/1 |
| 4,414,465 | 11/1983 | Newton et al. | 219/449 |
| 4,448,000 | 5/1984 | Manuccia et al. | 52/208 |
| 4,470,369 | 9/1984 | Edgerton | 118/723 |
| 4,489,234 | 12/1984 | Harnden, Jr. et al. | 219/347 |
| 4,501,072 | 2/1985 | Jacobi, Jr. et al. | 34/1 |
| 4,510,555 | 4/1985 | Mori | 362/32 |
| 4,558,660 | 12/1985 | Nishizawa et al. | 118/725 |
| 4,581,248 | 4/1986 | Roche | 427/53.1 |
| 4,640,224 | 2/1987 | Bunch et al. | 118/725 |
| 4,649,261 | 3/1987 | Sheets | 219/390 |
| 4,680,447 | 7/1987 | Mahawili | 219/343 |
| 4,680,451 | 7/1987 | Gat et al. | 219/411 |
| 4,694,143 | 9/1987 | Nishimura et al. | 219/388 |
| 4,698,486 | 10/1987 | Sheets | 250/492.2 |

(List continued on next page.)

FOREIGN PATENT DOCUMENTS

| | | | |
|---|---|---|---|
| 0 308 388 A1 | 9/1988 | European Pat. Off. | H05B 3/00 |
| 308388 | 3/1989 | European Pat. Off. | H05B 3/00 |
| 0 299 243 B1 | 8/1992 | European Pat. Off. | |
| 59-017253 | 1/1984 | Japan . | |
| 60-000727 | 1/1985 | Japan . | |
| 60-253939 | 12/1985 | Japan | G01J 5/02 |
| 63-39930 | 3/1988 | Japan . | |

OTHER PUBLICATIONS

Spectrum, Model 211, Operation and Maintenance Manual, pp. 2.2–6, 2.2–7, 3.0–2, AG 0040305–307. no date.

Hodul et al., "Measurement of Dynamic Temperature Uniformity in Rapid Thermal Processing," *Solid State Technology*, May 1988, pp. 209–211.

Akiyama et al., "Critical Radial Temp. Gradient Inducing Slip Dislocations in Silicon Epitaxy Using Dual Heating of the Two Surfaces of a Wafer," *Japan. Jour. of Applied Phys.*, V. 25, No. 11, Nov. 1986, pp. 1619–1622.

*Primary Examiner*—Joseph Pelham
*Attorney, Agent, or Firm*—Fish & Richardson

[57] ABSTRACT

A rapid thermal heating system which includes a plurality of radiant energy sources to irradiate a predetermined area of a substrate. The radiant energy sources are associated with reflectors wherein portions of radiated areas of adjacent radiant energy sources overlap. The reflectors include a flared specular surface at their light emitting end or outlet. The flared specular surface reflects radiant energy toward the substrate.

33 Claims, 10 Drawing Sheets

U.S. PATENT DOCUMENTS

| | | | |
|---|---|---|---|
| 4,749,843 | 6/1988 | Abramson | 219/411 |
| 4,761,538 | 8/1988 | Chiba et al. | 219/497 |
| 4,789,771 | 12/1988 | Robinson et al. | 219/405 |
| 4,796,562 | 1/1989 | Brors et al. | 118/725 |
| 4,818,327 | 4/1989 | Davis et al. | 156/345 |
| 4,820,377 | 4/1989 | Davis et al. | 156/643 |
| 4,830,700 | 5/1989 | Davis et al. | 156/345 |
| 4,832,777 | 5/1989 | Davis et al. | 156/345 |
| 4,832,779 | 5/1989 | Fisher et al. | 156/345 |
| 4,836,138 | 6/1989 | Robinson et al. | 118/666 |
| 4,854,263 | 8/1989 | Chang et al. | 118/715 |
| 4,859,832 | 8/1989 | Uehara et al. | 219/411 |
| 4,891,499 | 1/1990 | Moslehi | 219/502 |
| 4,910,387 | 3/1990 | McWilliams | 219/464 |
| 4,911,103 | 3/1990 | Davis et al. | 118/725 |
| 4,919,542 | 4/1990 | Nulman et al. | 374/9 |
| 4,924,073 | 5/1990 | Chiba | 219/413 |
| 4,956,538 | 9/1990 | Moslehi | 219/121.6 |
| 4,977,307 | 12/1990 | Motoi | 219/392 |
| 5,000,113 | 3/1991 | Wang et al. | 118/723 |
| 5,155,336 | 10/1992 | Gronet | 219/411 |
| 5,156,820 | 10/1992 | Wong et al. | 422/186.05 |
| 5,215,588 | 6/1993 | Rhieu | 118/715 |
| 5,253,324 | 10/1993 | Wortman | 219/416 |
| 5,317,492 | 5/1994 | Gronet et al. | 362/294 |
| 5,332,442 | 7/1994 | Kubodera et al. | 118/725 |
| 5,345,534 | 9/1994 | Najm et al. | 392/422 |
| 5,436,172 | 7/1995 | Moslehi | 437/8 |
| 5,445,675 | 8/1995 | Kubodera et al. | 118/725 |
| 5,446,824 | 8/1995 | Moslehi | 392/416 |
| 5,446,825 | 8/1995 | Moslehi et al. | 392/416 |
| 5,487,127 | 1/1996 | Gronet et al. | 392/416 |
| 5,551,985 | 9/1996 | Brors et al. | 118/725 |
| 5,561,735 | 10/1996 | Camm | 392/416 |
| 5,577,157 | 11/1996 | Sopori | 392/418 |

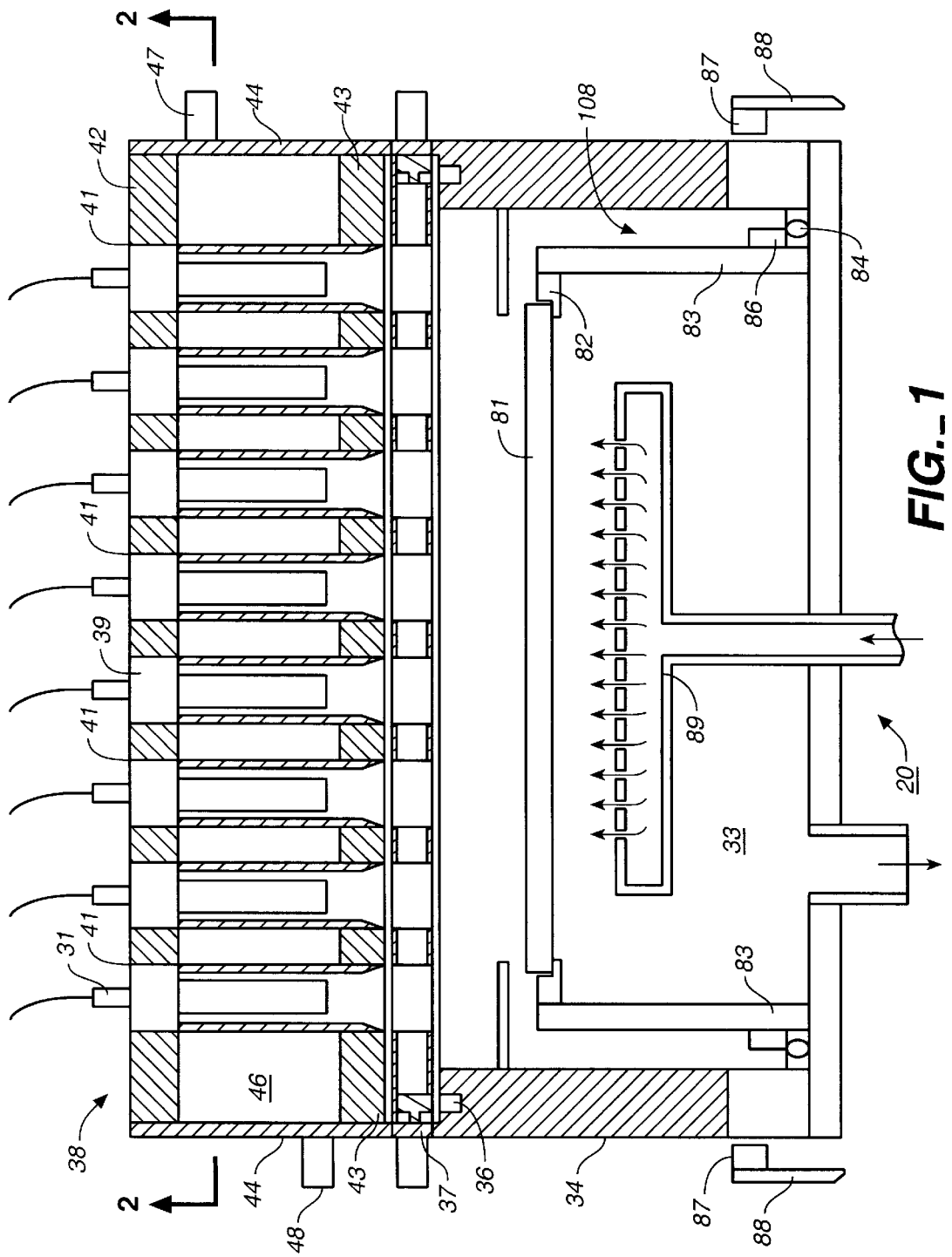
FIG._1

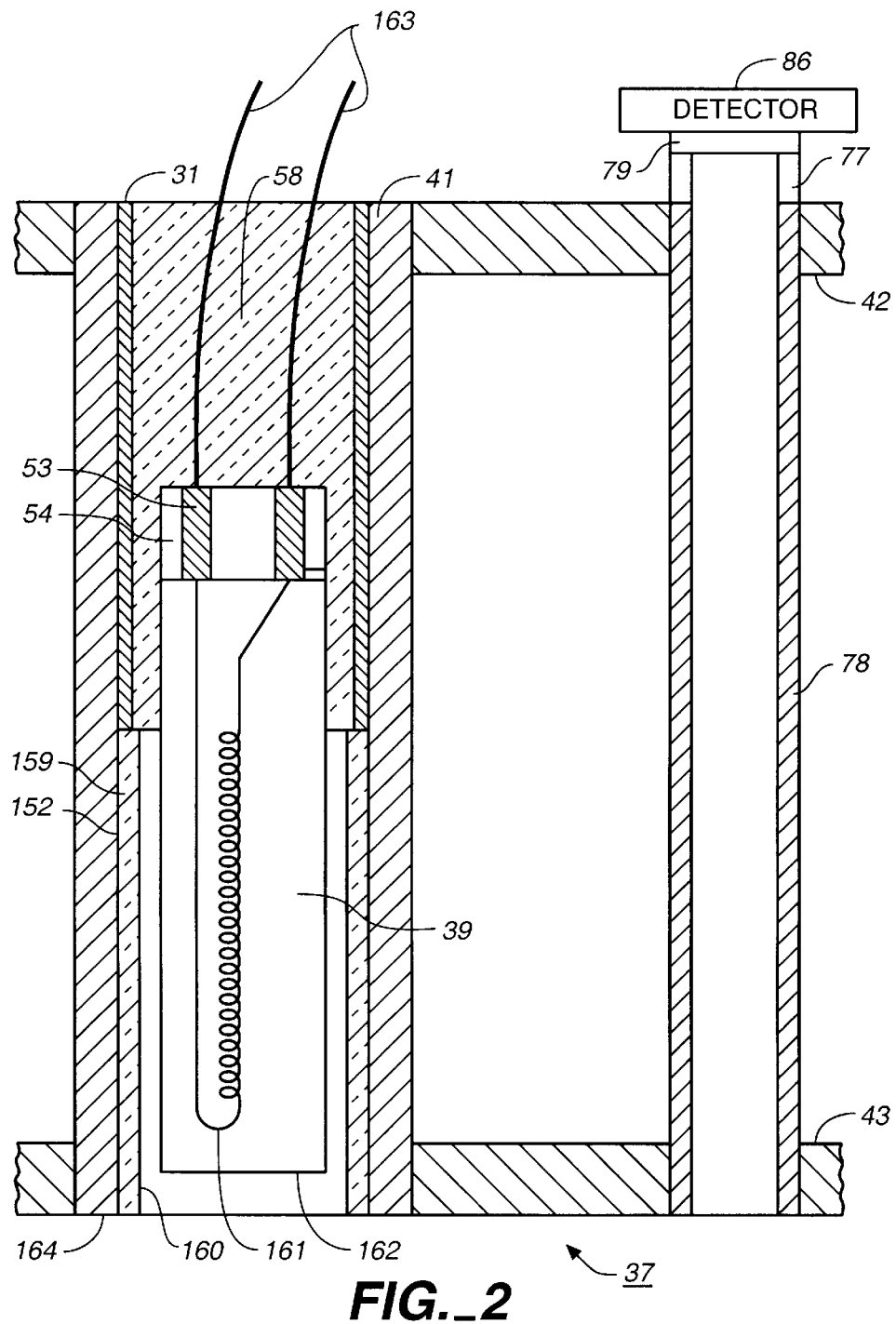
FIG._2

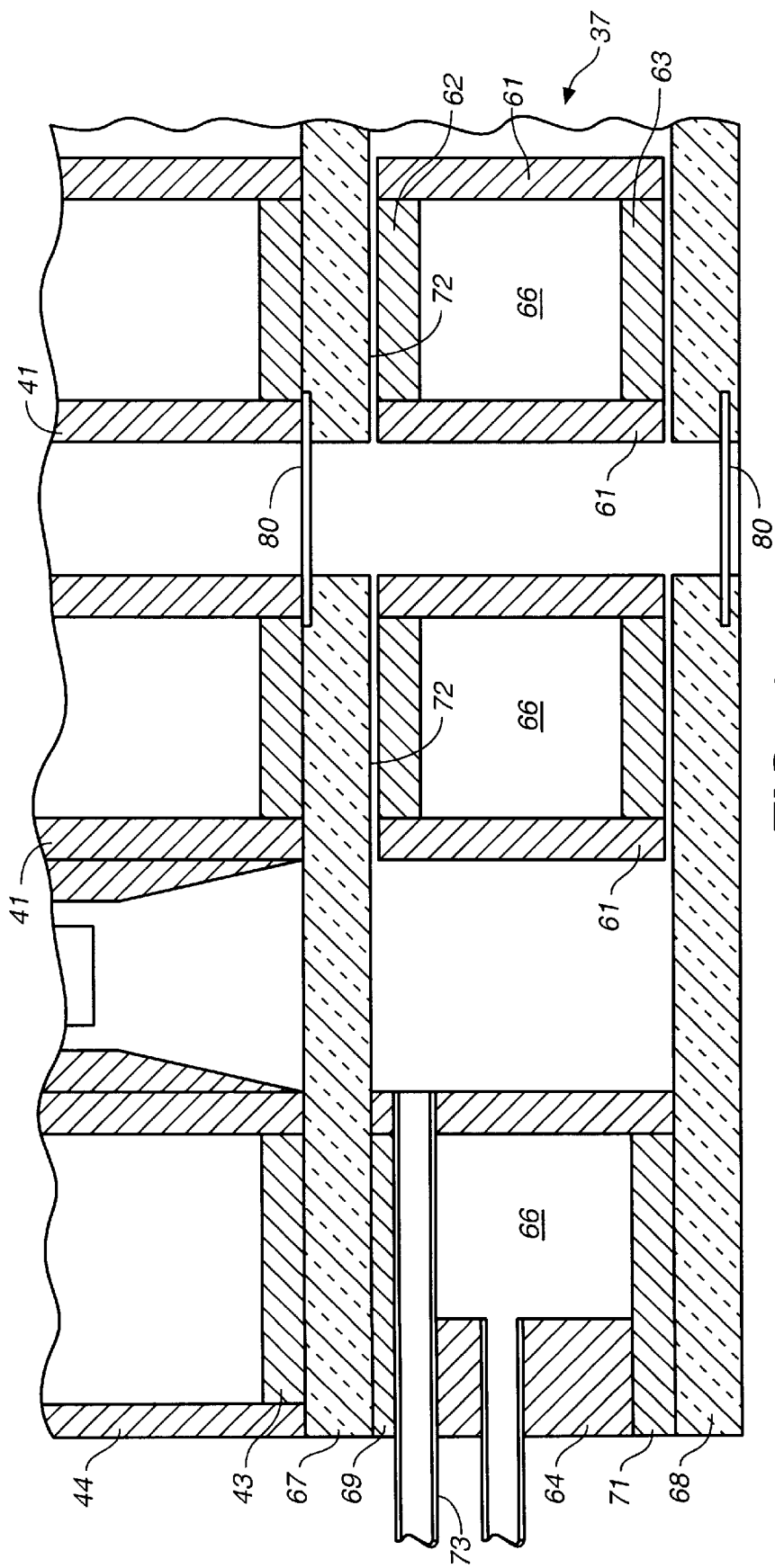
FIG._3

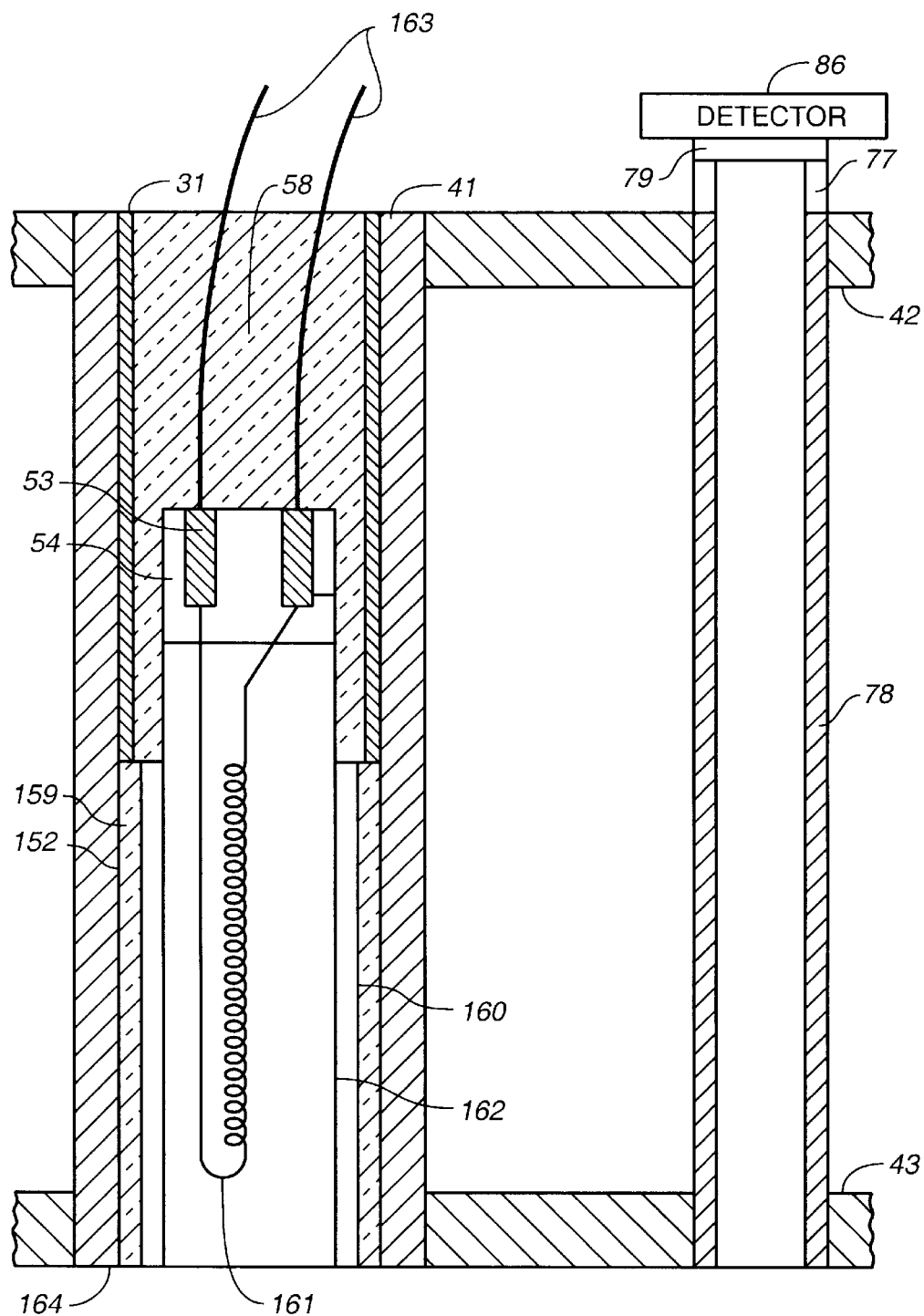
FIG._4

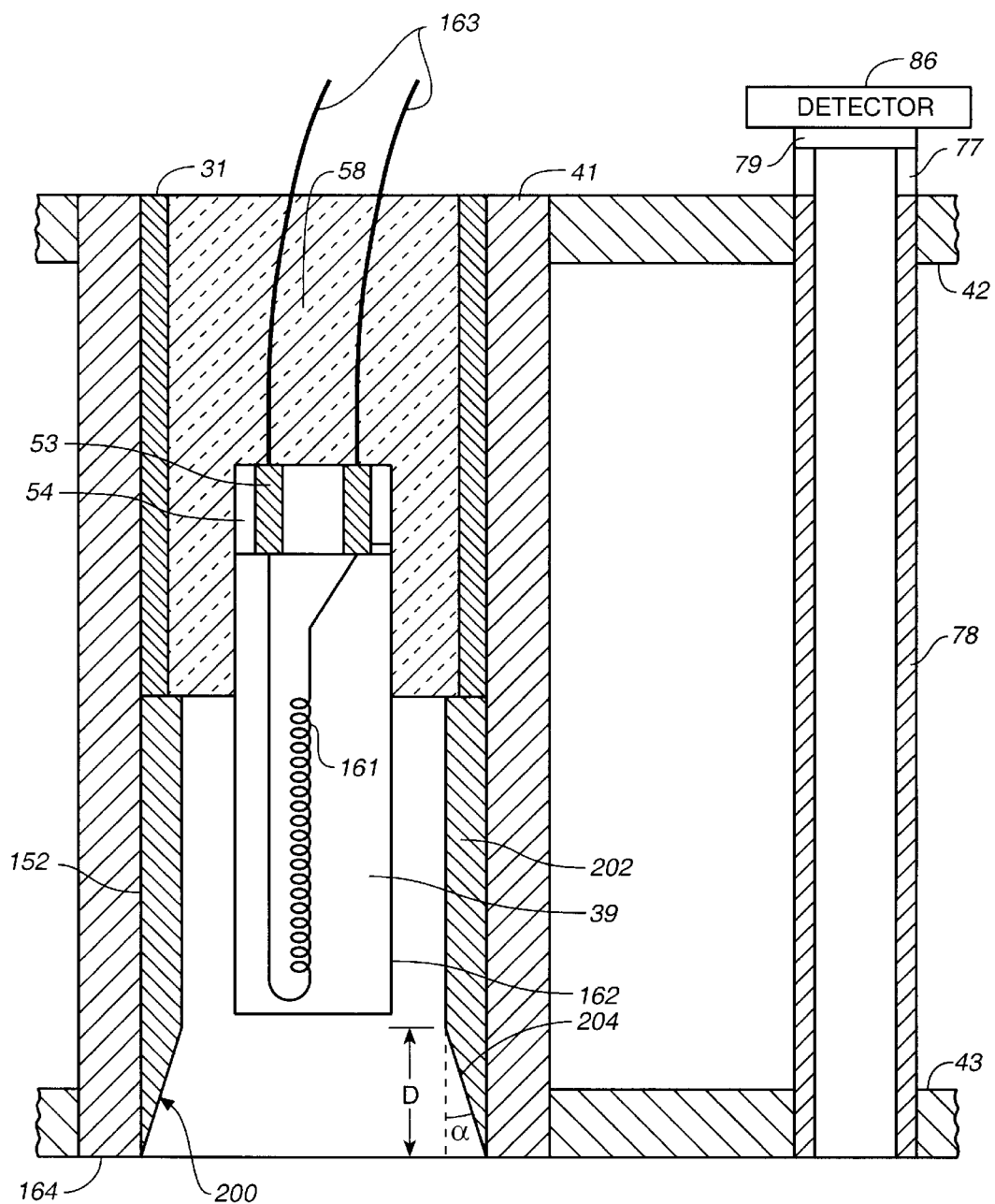
FIG._5a

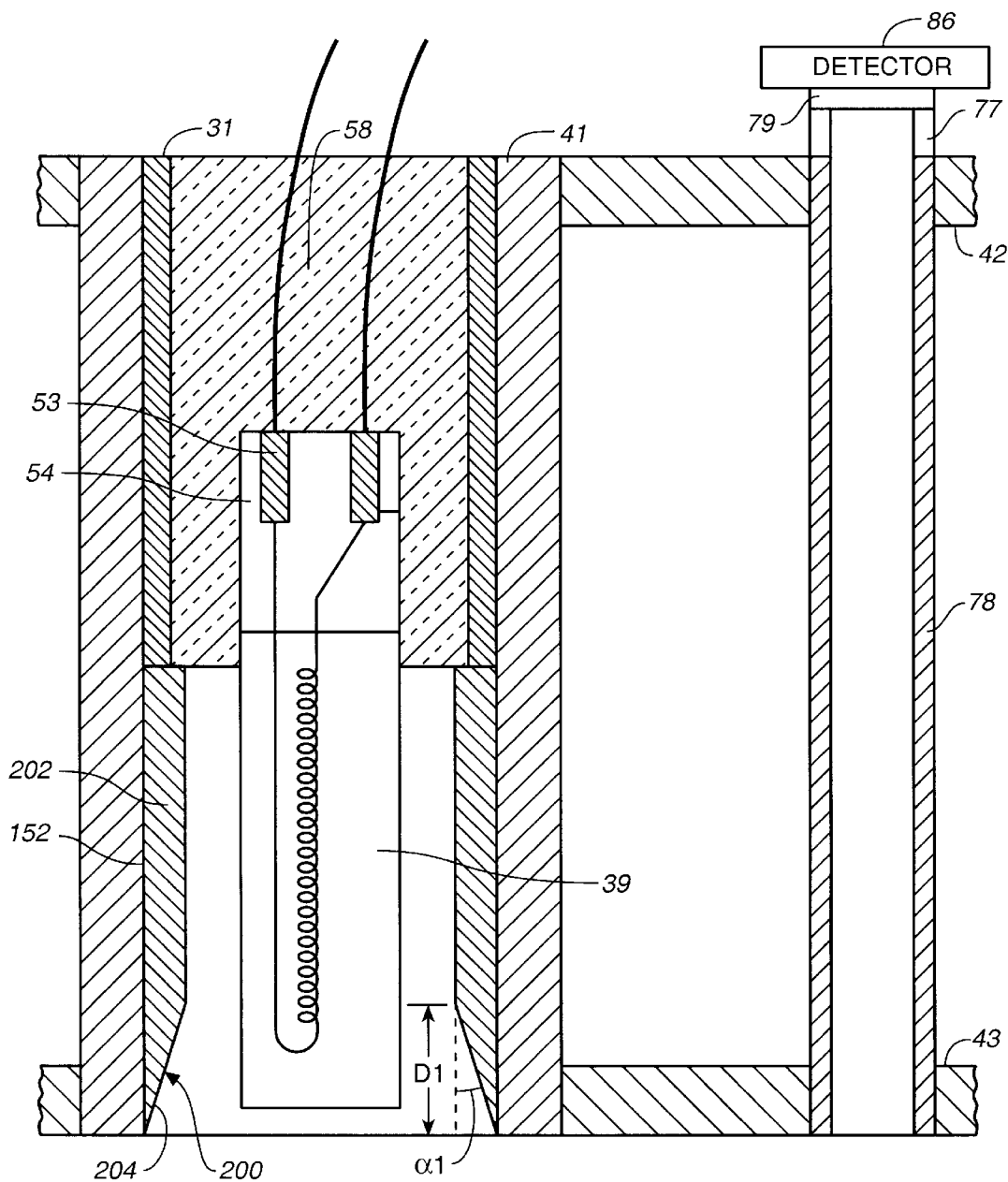
FIG._5b

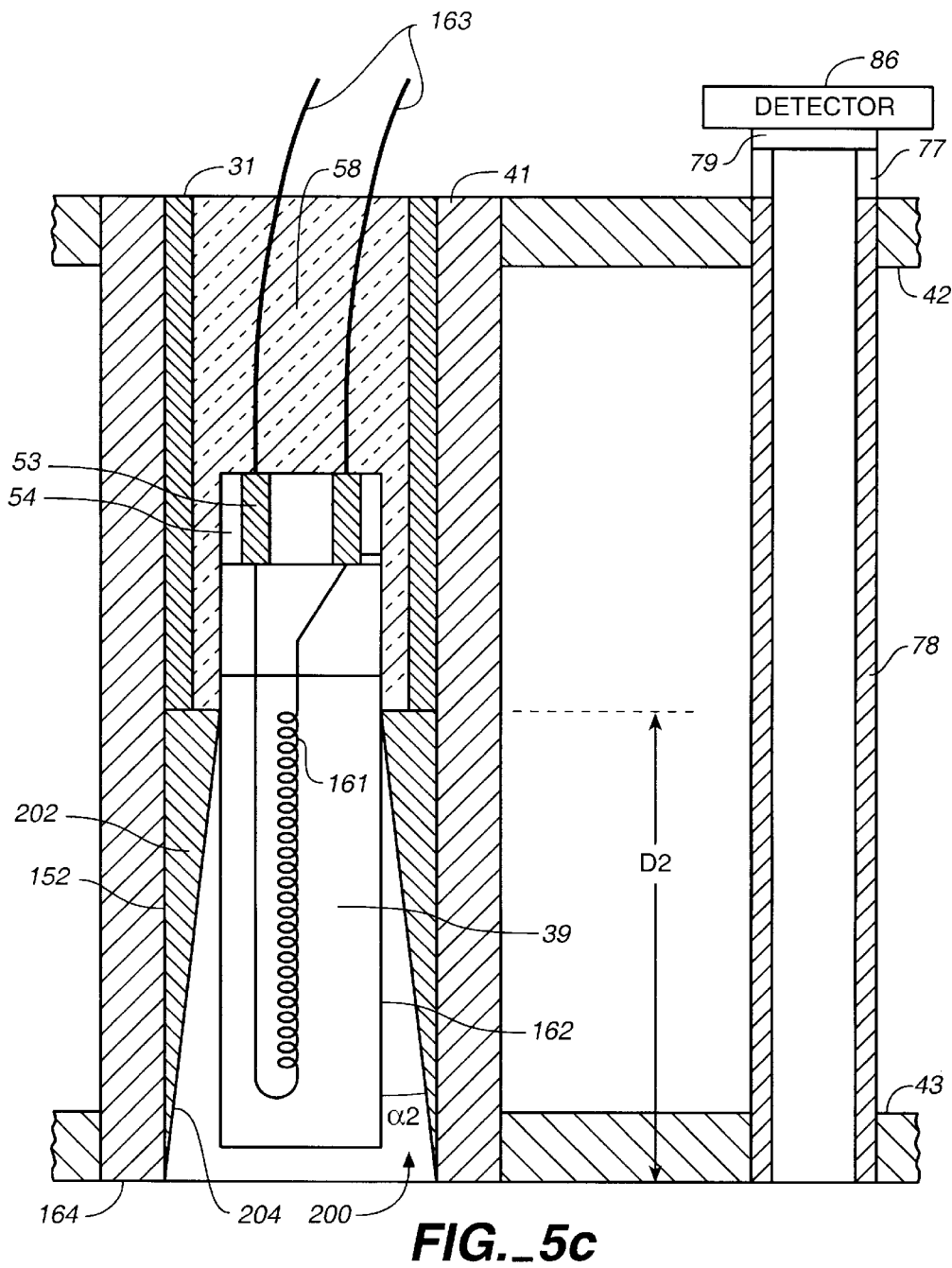
FIG._5c

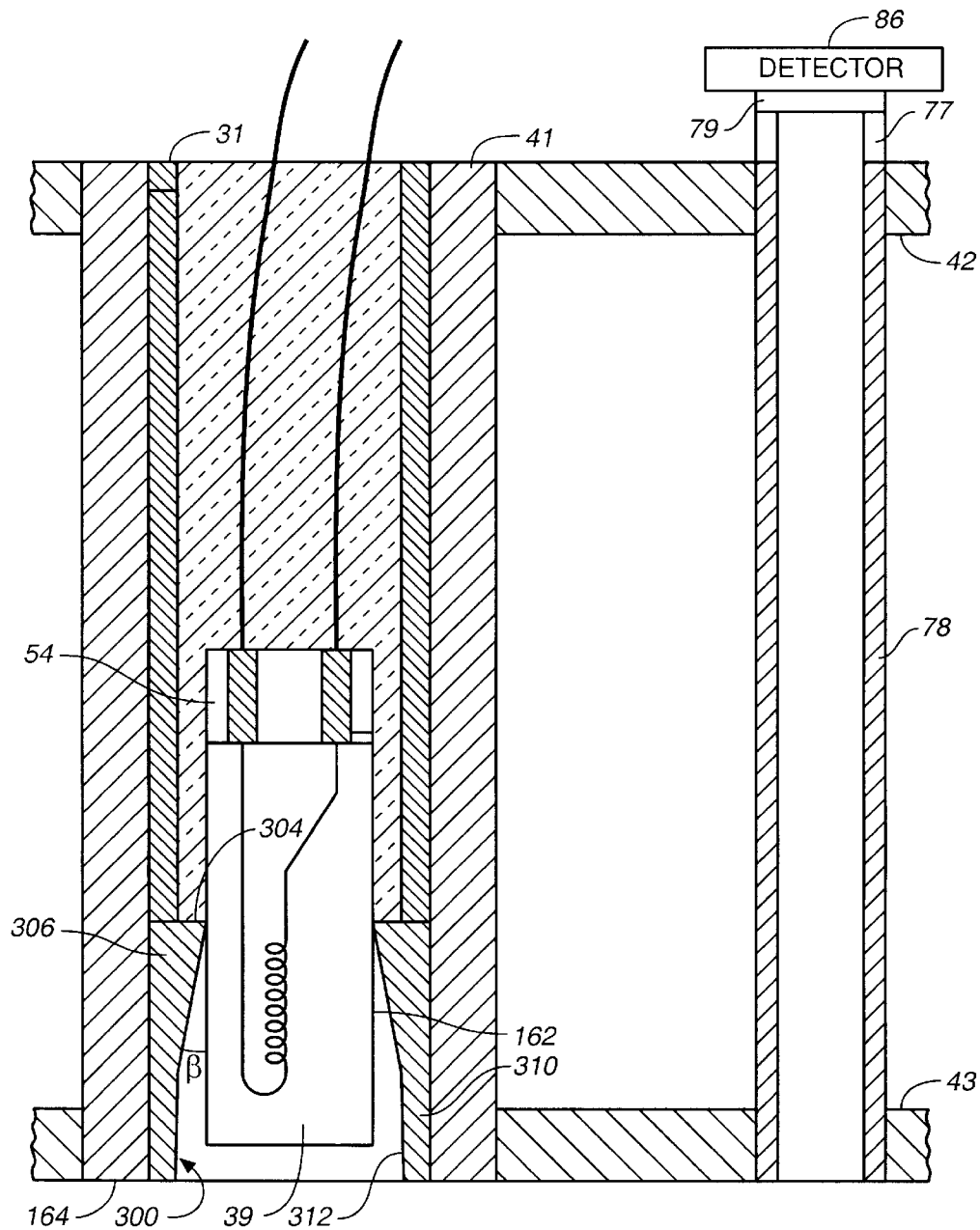
FIG._6a

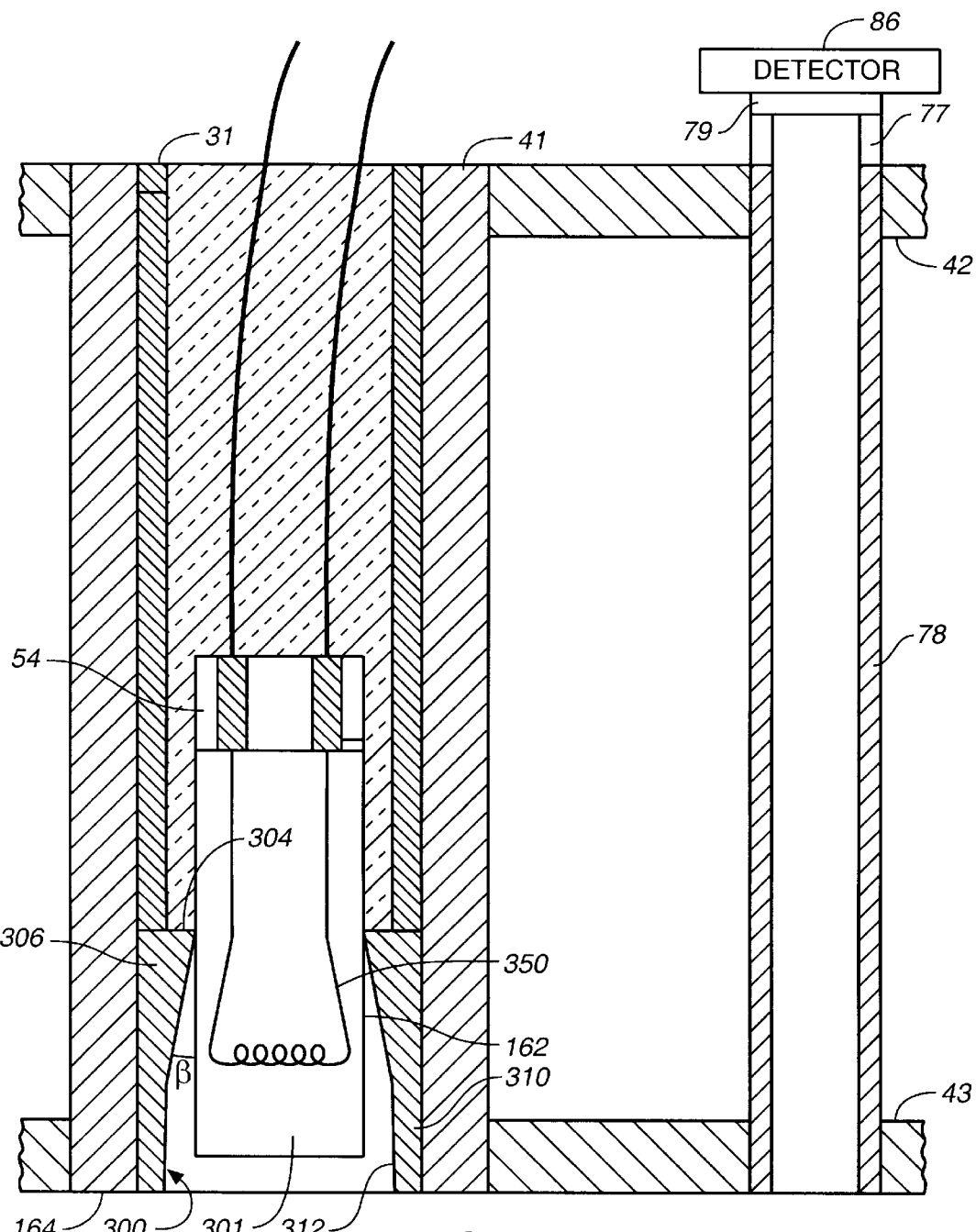
FIG._6b

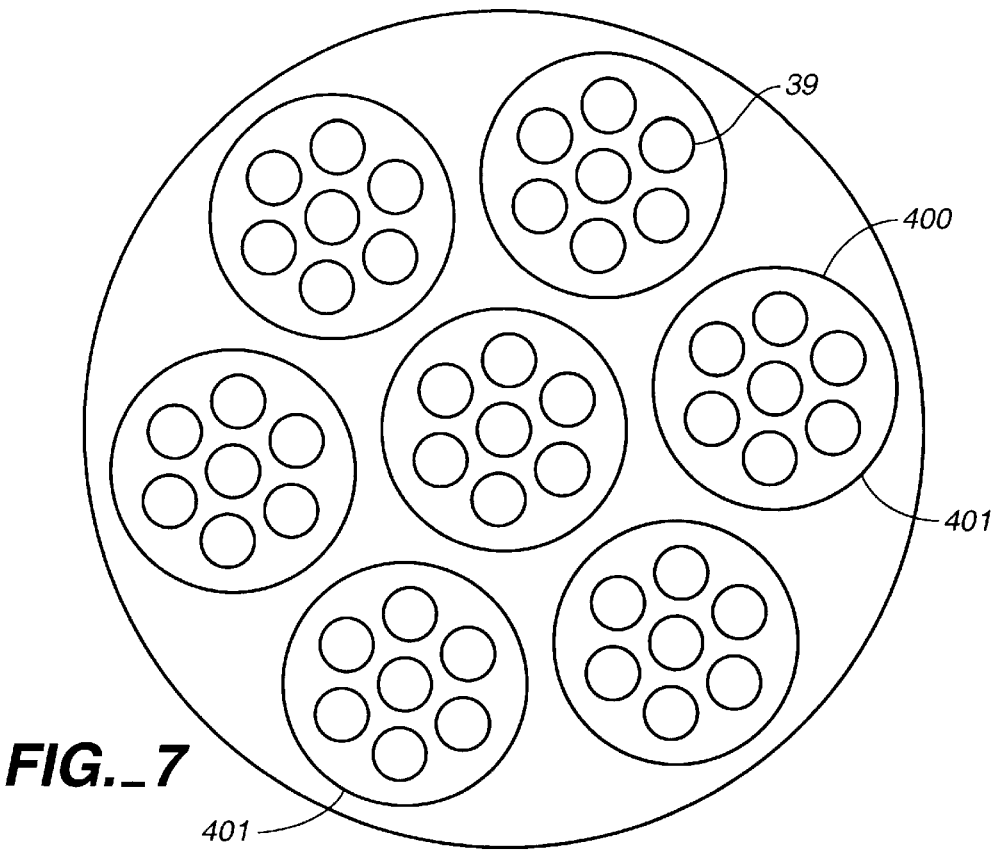
FIG._7
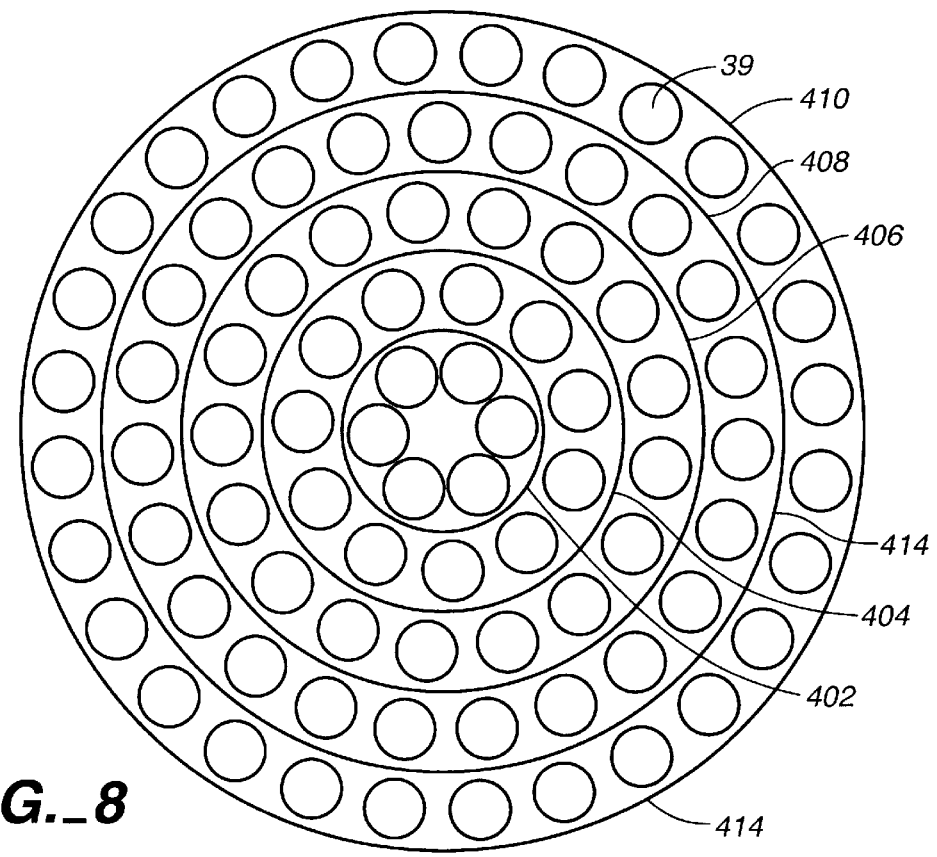
FIG._8

METHOD AND APPARATUS FOR ENHANCING THE EFFICIENCY OF RADIANT ENERGY SOURCES USED IN RAPID THERMAL PROCESSING OF SUBSTRATES BY ENERGY REFLECTION

BACKGROUND OF THE INVENTION

This invention relates generally to a rapid thermal heating apparatus and method for rapidly heating a substrate, and more particularly to a radiant energy heating source having improved controllability of the spatial heating of a substrate by reflecting energy from a radiant energy source.

Single-wafer processing of semiconductors is a powerful and versatile technique for the fabrication of very-large-scale integrated (VLSI) and ultra-large-scale integrated (ULSI) electronic devices. It combines low thermal mass photon-assisted rapid wafer heating with reactive ambient semiconductor processing. Both the wafer temperature and the process environment can be quickly changed (because of short transient times) and, as a result, each fabrication step and its sub-processes can be independently optimized in order to improve the overall performance of the fabricated devices.

Rapid thermal processing (RTP) of semiconductor wafers provides a capability for better wafer-to-wafer process repeatability in a single-wafer lamp-heated thermal processing reactor. Numerous silicon fabrication technologies use RTP techniques, including rapid thermal annealing (RTA), rapid thermal cleaning (RTC), rapid thermal chemical vapor deposition (RTCVD), rapid thermal oxidation (RTO), and rapid thermal nitridation (RTN). For example, RTCVD processes to form dielectrics (e.g., oxides and nitrides), semiconductor materials (e.g., amorphous silicon and polysilicon), as well as conductors (e.g., aluminum, copper, tungsten, and titanium nitride) can be performed using advanced RTP techniques for VLSI and ULSI device fabrication.

In the semiconductor industry, it is desirable to obtain temperature uniformity over the surface of each substrate during temperature cycling of substrates. Surface temperature uniformity provides uniform process variables (e.g., layer thickness, resistivity and etch depth) for various temperature-activated steps such as film deposition, oxide growth and annealing. In addition, temperature uniformity is necessary to prevent thermal stress-induced damage such as warpage, defect generation and slip.

In the particular application of CMOS gate dielectric formation by RTO or RTN, thickness, growth temperature, and uniformity of the gate dielectrics are critical parameters that influence the overall device performance and fabrication yield. Currently, CMOS devices are being made with dielectric layers that are only 60–80 Angstroms thick and for which thickness uniformity must be held within +/− 2 Angstroms. This level of uniformity requires that temperature variations across the substrate during high temperature processing cannot exceed a few degrees Centigrade (° C.).

The wafer itself often cannot tolerate even small temperature differentials during high temperature processing. If the temperature differential is allowed to rise above about 1–2° C., at 1200° C., then the resulting stress is likely to cause slip in the silicon crystal. The resulting slip planes will destroy any devices through which they pass.

Equipment manufacturers have spent significant design resources to insure uniform wafer heating in RTP systems. For example, U.S. Pat. No. 5,155,336 ('336 patent), assigned to the assignee of the subject application, discloses an RTP chamber that utilizes a plurality of radiant energy sources arranged to supply heat to a substrate. The radiant energy sources are positioned so that irradiated areas of the substrate corresponding to adjacent radiant energy sources overlap. This overlap is caused by overlapping distributions of the radiant energy density - - - also referred to as energy flux distributions and measured in units of energy/area - - - of each radiant energy source. The overlap helps to ensure that the entire surface of the substrate is irradiated uniformly.

Relative radiation intensity across a substrate is dependent upon the overlapping distributions from adjacent radiant energy sources. Additional radiation, however, is contributed to portions of the substrate's surface from non-adjacent radiant energy sources through multiple reflections of radiant energy off the surface of the substrate and the surfaces of the RTP chamber. The more reflective the surface of the substrate, the more energy is reflected off the substrate surface to be transmitted about the RTP chamber, to contact the substrate's surface at locations remote from the radiant energy's source.

As a result of the overlap of flux distributions and the multiple reflections of radiant energy, different radiant energy sources contribute in varying degrees to the radiation density at any one point on the substrate surface. This fact complicates the process of controlling the temperature profile across the substrate's surface through manipulating the energy supplied to the various radiant energy sources.

It has also been recognized that a trade-off occurs between the controllability of the temperature uniformity across the substrate surface and the efficiency of the radiant energy sources. For example, in an RTP chamber, as the energy flux distribution from a radiant energy source is restricted by, for example, narrowing the outlet of the source's light pipe to achieve better controllability of the substrate's surface temperature, the efficiency of the radiant energy source decreases because less energy is directed toward the substrate. Conversely, if the efficiency of the radiant energy source is increased by increasing the size of the outlet, and necessarily the distribution of radiant energy released from the radiant energy source, the controllability decreases because of the increased multiple reflections and flux distribution overlaps, described above. Accordingly, it would be desirable to improve the efficiency of the radiant energy sources while not decreasing the controllability of the distribution of the radiant energy directed toward the substrate.

It is a general object of this invention to provide an improved radiant energy heating source for rapid thermal processing of substrates such as semiconductor wafers.

It is further object of this invention to provide a radiant energy heating source which allows improved spatial control of radiant energy applied to a substrate while realizing improved radiant energy source efficiency.

It is another object of this invention to provide a radiant energy heating source which includes a plurality of reflectors having a tapered portion at the light emitting end which direct energy onto pre-determined overlapping areas of a substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a thermal heating apparatus for heating a substrate, during rapid thermal processing of the substrate. The apparatus includes at least two radiant energy sources and at least one reflector. The reflector directs radiant energy from at least one of the radiant energy sources toward the substrate. The reflector has an aluminum specular reflector sleeve positioned within the reflector at a first end thereof to reflect radiant energy toward the substrate to radiate a limited area of the substrate.

In another aspect of the invention, the specular reflector includes a tapered region to reflect radiant energy from the radiant energy source toward a substrate. The specular reflector need not be aluminum.

In another aspect of the invention, the thermal heating apparatus includes a specular reflector surface at the first end of the reflector. The specular reflector surface includes upper and lower regions. The upper region is tapered to reflect radiant energy toward said substrate.

In another aspect of the present invention, the thermal heating apparatus includes a processing chamber in which the substrate is disposed. The processing chamber includes a window positioned between the radiant energy sources and the substrate. Radiant energy is reflected from a specular reflector tapered region of a light pipe through the window into the chamber to irradiate the substrate.

In another aspect of the present invention, a thermal heating apparatus includes at least one reflector having a flared specular reflector sleeve to reflect radiant energy from a radiant energy source and direct it toward the substrate to radiate a limited area of the substrate.

In another aspect of the present invention, an apparatus for rapid thermal processing of a substrate includes a evacuable chamber having a window, and a plurality of radiant energy sources disposed outside of the chamber and positioned adjacent to the window. The radiant energy sources have a central longitudinal axis that extends in a substantially perpendicular direction relative to the window. Reflectors associated with the radiant energy sources direct radiant energy through the window to radiate predetermined regions in a substrate in the chamber with a pattern of radiation intensity. The reflectors extend along a major portion of the longitudinal axis of the radiant energy sources. The reflectors include a tapered region at a first end adjacent to the window to reflect radiant energy from the radiant energy source and direct it toward the substrate. The radiant energy sources and the reflectors are positioned so that a portion of a predetermined region radiated by one radiant energy source overlaps a portion of a predetermined region radiated by and adjacent radiant energy source to provide radiation intensity across the substrate that is dependent upon the intensity of adjacent radiant energy sources.

Among the advantages of the present invention are the following. A thermal heating apparatus providing improved efficiency of the radiant energy sources while not decreasing the controllability of the distribution of the radiant energy directed toward the substrate is provided.

BRIEF DESCRIPTION OF THE DRAWINGS

The accompanying drawings, which are incorporated in and constitute a part of the specification, schematically illustrate the invention and, together with the general description given above and the detailed description given below, serve to explain the principles of the invention.

FIG. 1 is a schematic cross-sectional view of an RTP system in accordance with one embodiment of the present invention.

FIG. 2 is an enlarged schematic view showing a light pipe in accordance with one embodiment of the present invention.

FIG. 3 is an schematic enlarged view showing a window assembly in accordance with one embodiment of the present invention.

FIG. 4 is a schematic view showing a light pipe in accordance with an alternative embodiment of the present invention.

FIG. 5A is an enlarged schematic view showing a light pipe including a tapered specular reflector at a light emitting end in accordance with the present invention.

FIG. 5B is a schematic view of the light pipe of FIG. 5A including a tapered specular reflector with a tapered portion opposite the lamp envelope according to another embodiment of the present invention.

FIG. 5C is a schematic view of the light pipe of FIG. 5A including a tapered specular reflector tapered along its entire length according to another embodiment of the present invention.

FIG. 6A is an enlarged schematic view showing a light pipe including a low power radiant energy source in accordance with the present invention.

FIG. 6B is a schematic view showing the light pipe of FIG. 6A including a low power radiant energy source having a horizontal filament in accordance with the present invention.

FIG. 7 is a schematic plan view illustrating an alternate arrangement of reflectors and radiant energy sources, in combination with which the present invention may be used, in which multiple reflectors surround multiple energy sources.

FIG. 8 is a schematic plan view illustrating another alternate arrangement of reflectors and radiant energy sources, in combination with which the present invention may be used, in which multiple, concentric reflectors surround multiple energy sources.

DESCRIPTION OF A PREFERRED EMBODIMENT(S)

The invention described herein can be used in conjunction with a rapid thermal heating system of the sort described in U.S. Pat. No. 5,155,336, the entire disclosure of which is hereby incorporated by reference. The processing chamber may be operated at either atmospheric or reduced pressure (vacuum), with either a single window or a dual window assembly, respectively. Only a reduced pressure system will be described below.

Referring initially to FIG. 1, the apparatus of this invention is shown associated with a reduced-pressure or vacuum RTP chamber 20 having an evacuable chamber 33, a window assembly 37, and a radiant energy assembly 38 overlying the window assembly. The walls of the chamber 33 are schematically shown at 34. The window assembly 37 forms the upper wall of chamber 33 and is sealed thereto by 0 rings 36. A substrate 81, such as a silicon wafer, in chamber 33 is supported at its edge by spaced support fingers 82 mounted on a support tube 83. The RTP chamber may also be used to process other sorts of substrates such as plastic panels, glass plates or disks and plastic workpieces.

Support tube 83 is rotatably supported from chamber walls 34 by a bearing assembly 84. Magnets 86 are mounted on support tube 83. The magnetic fields of magnets 86 extend through walls 34 and couple to magnets 87 mounted on a drive ring 88 which is suitably driven (not shown). Rotation of the ring causes support tube 83 and substrate 81 to rotate. During thermal processing a support structure, generally indicated at 108, is rotated at about 90 RPM. The magnetic coupling eliminates the need for an elaborate vacuum sealed drive assembly. A gas injection head 89 is provided for injecting processing gases into chamber 33 whereby various processing steps may be carried out in the chamber.

The radiant energy assembly 38 includes a plurality of radiant energy sources or lamps 39 associated with a reflector. In one embodiment, lamps 39 are 750 watt, 120 volt Tungsten Halogen lamps, part no. ULS-750-QJKT, manufactured by Sylvania, Inc., 100 Endicott Street, Danvers, Mass. 01923. The reflector may be a light pipe 41 with a lamp mounted therein. The light pipe may be constructed of stainless steel, brass, aluminum, or other metals. In one embodiment, stainless steel light pipes manufactured by Luxtron Corporation-Accufiber Division, 2775 Northwestern Parkway, Santa Clara, Calif. 95051-0903, may be used. The ends of the light pipes 41 are brazed, welded or otherwise secured to openings in upper and lower cooling chamber walls 42 and 43. A cylindrical wall 44 may be brazed, welded or otherwise secured to the peripheral edge of the cooling chamber walls 42 and 43, and together therewith defines a cooling chamber 46.

Coolant, such as water, is introduced into chamber 46 via an inlet 47 and is removed at an outlet 48. The fluid travels in the space between the various light pipes 41, thereby cooling them. Baffles (not shown) may be included to ensure proper flow through chamber 46.

Referring now to FIG. 2, each light pipe 41 includes a wall 152 and a specular reflector 159 disposed at an end 164 proximal to window assembly 37. Wall 152 includes an upper portion which may be an integral part of light pipe 41 or may be formed as an upper sleeve 31 disposed within light pipe 41. Upper sleeve 31 may be constructed from stainless steel.

Specular reflector 159 may be formed as a sleeve disposed within light pipe 41. Alternatively, specular reflector 159 may be an integral part of light pipe 41. Specular reflector 159 may be constructed from aluminum. The more reflective the surface of reflector 159, the more energy is reflected to reach substrate 81 in chamber 33. Accordingly, face 160 of specular reflector 159 is polished to improve reflectivity. Polishing may be accomplished by slowly machining specular reflector 159, or by the use of a polishing or buffing wheel after machining. In one embodiment, after polishing, surface 160 is gold plated to prevent the surface from oxidizing and to maintain a high level of reflectivity. In order to prevent migration of gold into specular reflector 159, a nickel diffusion barrier is placed on surface 160 prior to gold plating. The nickel barrier is applied using standard electroless nickel plating techniques, and thereafter high purity gold is applied by gold plating.

Each lamp 39 includes a base 54, filament 161, lamp envelope 162, lead wires 163, and conductors (molybdenum plates) 53. Conductors 53 transmit electrical energy provided by lead wires 163 to filament 161. Filament 161 may be wound as a coil with its axis parallel to that of the long central axis of lamp envelope 162. Most of the light from the lamps is emitted perpendicular to this axis toward wall 152 of the surrounding light pipe 41.

Radiant energy from lamp 39 is directed out of its associated light pipe's end 164 after many reflections. However, some of the energy is absorbed at base 54. This can cause the base of the lamp to reach much higher temperatures as compared to a lamp radiating in open space. If the base gets too hot, the average lamp lifetime can be substantially reduced. Thus, a means for cooling the lamp base is provided. Specifically, a ceramic potting 58 may be placed between lamp base 54 and upper sleeve 31, thereby resulting in heat transfer from base 54 through ceramic potting 58 and upper sleeve 31 to the surrounding wall 152. The ceramic potting is a good heat conductor providing excellent heat transfer from the base to the surrounding walls.

Another lamp failure mechanism occurs when the temperature of the lamp envelope increases above 550° C. At this temperature, the lamp envelope 162 may soften enough to balloon or blister. This is a particular problem when utilizing tungsten halogen bulbs which operate with very high internal gas pressures. This problem is alleviated in the present invention by using an aluminum specular reflector 159.

A pyrometer or detector 86 is shown in FIG. 2 cooperating with an adaptor 77 which is connected to a thin light pipe 78 extending between upper and lower cooling chamber walls 42 and 43. The detector 86 provides an output signal indicative of the surface temperature of the substrate within the field of view of light pipe 78. A filter 79 is inserted in front of detector 86 and is selected to pass infrared energy of wavelength region 4.8–5.2 micrometers, to avoid interference from the radiant energy delivered by light pipes 41.

Radiant energy assembly 38 comprising the plurality of light pipes 41 and associated lamps 39 allows the use of thin quartz windows to provide an optical port for heating a substrate within chamber 33. For a reduced pressure (vacuum) RTP chamber, a water cooled quartz window assembly, which is fully described in U.S. Pat. No. 5,155,336 and a portion of which is shown in detail in FIG. 3, is used. Window assembly 37 includes short light pipes 61 welded or otherwise secured to, or integral with, upper and lower flange plates 62 and 63 which have their outer edges sealed to a wall 64. The light pipes 61 register with light pipes 41 in radiant energy assembly 38. Cooling water is injected into spaces 66 between light pipes 61 and lower flange plates 62 and 63 to cool light pipes 61 and lower flange plates 62 and 63. The flange plates and light pipes are sandwiched between two quartz plates 67 and 68. The quartz plates 67 and 68 are sealed to flange plates 62 and 63 by O-rings 69 and 71 respectively. A vacuum is produced in light pipes 61 by pumping through a tube 73 connected to one of the light pipes 61, which in turn is connected to the rest of the light pipes 61 by small recesses or grooves 72 in lower flange plate 62.

In window assembly 37, quartz windows 67 and 68 adjacent light pipe 78 are cut out and fitted with sapphire windows 80 which transmit light of a wavelength of about 6.5 micrometers. Thus, light from the substrate is allowed to pass through sapphire windows 80, up through light pipe 78, through filter 79 and to detector 86 which provides an output signal which is indicative of the surface temperature of the substrate within the field of view of the light pipe 78.

Referring back to FIG. 2, the length of light pipe 41 is selected to at least be as long as its associated lamp 39. It may be made longer provided that the power reaching the substrate is not substantially attenuated by the resulting increased reflections. FIG. 4 shows a geometry in which lamp 39 has a lamp envelope 162 which extends substantially to light pipe end 164. Specifically, lamp envelope 162 extends to approximately within 0.010 inches above end 164. This configuration results in an increase of efficiency in the radiant energy heating source of 35 percent (27 percent efficiency, e.g. power out/power in at the exit to light pipe 41) versus a similar configuration radiant energy heating source having a diffuse reflector and a quartz sleeve.

Alternatively, the lamp 39 may be mounted in light pipe 41 such that lamp envelope 162 may extend beyond the end of light pipe 41. This type of extended lamp configuration may improve the efficiency of the radiant energy assembly 38.

As shown in FIG. 5A, to increase the efficiency of radiant energy assembly 38, a light pipe 41 may include a flared specular reflector sleeve 200. The flared specular reflector may be formed as an integral part of light pipe 41, as opposed to a separate sleeve. Flared specular reflector sleeve 200 includes an uppermost cylindrical region 202 opposite (parallel to) lamp envelope 162 and a lower tapered region 204 having a length D. Lower tapered region 204 is defined by a taper angle a which can be approximately 1 to 89 degrees, with 1 to 30 degrees preferred. Tapered region 204 may constitute a substantial portion of the length of flared specular reflector sleeve 200, with 30 to 50 percent of the overall length preferred. As the taper angle increases, the amount of energy escaping from light pipe 41 increases, thereby increasing the efficiency of the lamp 39. Taper angle α may be empirically optimized to provide uniform illumination, any desired spatial intensity profile, or desired lamp efficiency.

Tapered region 204 may start at a point level with the end of lamp envelope 162, although other configurations are possible, depending on the lamp efficiency desired. For example, FIG. 5B shows a tapered region 204 having a taper angle α1, of approximately 4 degrees, which starts opposite lamp envelope 162 resulting in a tapered region having a length D1 of approximately 30 percent of flared specular reflector sleeve 200. In this embodiment using the Sylvania 750 watt Tungsten Halogen lamp (ULS-750-QJKT), a 60 percent increase in efficiency was measured (32%; efficiency, e.g. power out/power in at exit of light pipe 41) versus a similar radiant energy heating system having a diffuse reflector and a quartz sleeve.

FIG. 5C shows a tapered region 204 having a taper angle α2, of approximately 2 degrees, which encompasses the entire length D2 of the flared specular reflector sleeve 200. The increased length of the flared specular reflector sleeve increases the efficiency of lamps 39, reflecting more radiant energy toward the exit of light pipe 41. However, as the length of the flared region increases, lamp cooling may become more problematic. As the tapered region length increases, a larger air gap is created between the lamp envelope and the reflector sleeve. Lamp base overheating may result because air is not a very good conductor of heat energy. The selection of the taper angle and the length of the tapered region should be made accounting for this potential anomaly.

FIG. 6A shows a flared specular reflector sleeve 300 having a first end 304 which is near base 54 of lamp 39, a tapered region 306 beginning at first end 304 and extending away from lamp envelope 162 at a taper angle β, and a lower region 310. Taper angle β can be approximately 1 to 89 degrees, with 10 to 45 degrees preferred. Tapered region 306 may constitute a substantial portion of the length of flared specular reflector sleeve 300, with 30 to 50 percent of the overall length preferred. In this embodiment, as the taper angle increases, the amount of energy escaping from light pipe 41 increases, thereby increasing the efficiency of the radiant energy heating source. In addition, where the filament length opposes the tapered region 306, radiant energy tends to be directly reflected parallel to the central axis of lamp envelope 162. The portion of the tapered region which opposes the lamp filament tends to collimate the radiant energy.

Lower region 310 is cylindrical in shape forming perpendicular walls relative to end 164 of light pipe 41. Alternatively, lower region 310 may itself be tapered at a different angle from taper angle β. Lower region 310 provides a second surface 312 for reflecting radiant energy out end 164 of light pipe 41.

In one embodiment, flared specular reflector 300 is constructed from aluminum and its outer surface (facing lamp 39) is gold plated to improve the reflective properties of the flared specular reflector.

The resulting increase in efficiency associated with this type of flared specular reflector sleeve is 150 percent versus a configuration having a diffuse reflector and a quartz sleeve (50 percent efficiency, e.g., power out/power at exit of light pipe 41).

With the addition of the flared specular reflector sleeve as described above in relation with FIGS. 5A, 5B, 5C, and 6A, a lower power radiant energy source may be used resulting in improved energy efficiency and increased source lifetimes. Specifically, in the embodiment of FIG. 6A, for example, lamp 39 may be a 410 watt, 82 volt, tungsten halogen lamp having tight coils, manufactured by Sylvania, part no. ULS-AM410/82. This lamp has a relatively short filament and smaller overall bulb diameter which approximates an energy point source better than longer and wider filament lamps. An energy point source allows for accurate focussing of almost all of the radiant energy generated by the source down the light pipe and onto a particular portion of the substrate, thereby enhancing controllability and minimizing energy losses. In addition, the smaller bulb diameter allows more space for radiant energy escape. The more space available between the lamp envelope and the reflector, the more radiant energy may escape out the end of the light pipe.

Alternatively, as is shown in FIG. 6B, lamp 301 may be configured to include a horizontal filament 350. Heretofore, a radiant energy source with a horizontal filament could not direct a sufficient amount of radiant energy to heat a corresponding portion of a substrate given the constraints on the diameter of the light pipes and the reflection issues. As was described above, increasing the diameter of the light pipes lead to complicated source control and reflection problems in maintaining uniformity of heating across the substrate surface. However, with the addition of a flared specular reflector sleeve (e.g. as is shown in conjunction with FIGS. 5A, 5B, 5C and 6A), the amount of radiant energy from lamp (lamp 301 in FIG. 6) that escapes light pipe 41 at end 164 is substantially increased, and may allow for the use of a lamp including a horizontal filament (filament 350 in FIG. 6B). In one embodiment, a 28 volt, horizontal filament tungsten halogen lamp rated at 230 watts, manufactured by Sylvania, Inc. was used.

The optimal combination(s) of lamp spacing, shape of the light pipes and taper angle can be empirically determined depending on the desired characteristics of the RTP chamber, and the substrate illumination requirements. By controlling these parameters, one is able to achieve a uniform intensity profile which can then be modulated by controlling the lamp power to individual lamps to provide dynamic temperature uniformity or simply improved steady state uniformity, while improving the energy efficiency of the individual lamps.

Although, the light pipes, radiant energy sources and tapered specular reflectors are disclosed as having a one-to-one correspondence, the reflector concept, in an alternative embodiment, may be implemented by surrounding multiple radiant energy sources with a reflector in conjunction with a tapered specular region. Such an arrangement is shown in FIG. 7, in which a reflector 400 surrounds seven energy sources 39. Each reflector 400 includes a tapered specular region 401 at the end closest to the substrate.

Alternatively, the reflectors may be concentrically arranged so that cylindrical reflectors with large diameters surround not only multiple radiant energy sources, but also reflectors with smaller diameters. FIG. 8 shows such an arrangement, in which five concentric, cylindrical reflectors 402, 404, 406, 408, and 410 surround multiple energy sources 39. Each reflector 402, 404, 406, 408, and 410 includes a tapered specular region 414 at one end, out of which radiant energy may be reflected toward a substrate.

In summary, described herein is an apparatus and method for increasing the efficiency of radiant energy sources by coupling a flared specular reflector sleeve about the radiant energy source thereby directing more energy toward the desired portion of the substrate.

The present invention has been described in terms of a preferred embodiment. The invention, however, is not limited to the embodiment depicted and described. Rather, the scope of the invention is defined by the appended claims.

What is claimed is:

1. A thermal heating apparatus for heating a substrate, during rapid thermal processing of the substrate, comprising:
   a process chamber having a window:
   at least two radiant energy sources disposed outside of said chamber and positioned adjacent to said window, said radiant energy sources having a central longitudinal axis that extends in a substantially perpendicular direction relative to said window:
   at least one reflector having a central axis and a first end, said reflector to direct radiant energy from at least one of said radiant energy sources out said first end toward said window; and
   a specular reflector surface at said first end including a tapered region adjacent to said window to reflect radiant energy from said at least one radiant energy source out of said first end, through said window and onto a substrate in said process chamber to radiate the surface of the substrate to be processed.

2. The apparatus of claim 1 wherein said tapered region reflects radiant energy from said at least one radiant energy source substantially parallel to said central axis.

3. The apparatus of claim 1 wherein said specular reflector has a first length and said tapered region comprises approximately 100 percent of said first length.

4. The apparatus of claim 1 wherein said tapered region comprises approximately 30 to 50 percent of said first length.

5. The apparatus of claim 4 wherein said tapered region comprises approximately 30 percent of said first length.

6. The apparatus of claim 1 wherein said tapered region has a taper angle α, α₁ or β of approximately 1 to 89 degrees.

7. The apparatus of claim 6 where said taper angle α or α₁ is approximately 1 to 30 degrees.

8. The apparatus of claim 6 wherein said taper angle β is approximately 10 to 45 degrees.

9. The apparatus of claim 2 wherein said radiant energy source includes a lamp envelope which is at least partially disposed within said reflector, said lamp envelope including a first end near a base portion of said lamp and a second end, said tapered region of said specular reflector beginning opposite said second end of said lamp envelope.

10. The apparatus of claim 2 wherein radiant energy source includes a lamp envelope which is at least partially disposed within said reflector, said lamp envelope including a first end near a base portion of said radiant energy source and a second end, said second end of said lamp envelope terminating at approximately said first end of said reflector.

11. The apparatus of claim 2 wherein said at least one radiant energy source includes a lamp envelope which is disposed within said reflector and said tapered region is opposite at least a portion of said lamp envelope.

12. The apparatus of claim 2 wherein said specular reflector is a sleeve.

13. The apparatus of claim 12 wherein said specular reflector has an outer surface covered in a material reflective of radiant energy.

14. The apparatus of claim 13 wherein said material reflective of radiant energy is gold.

15. The apparatus of claim 13 wherein said specular reflector sleeve is constructed of aluminum.

16. The apparatus of claim 2 wherein said radiant energy source includes a filament oriented substantially perpendicular to said central axis.

17. A thermal heating apparatus for heating a substrate, during rapid thermal processing of the substrate, comprising:
   a process chamber having a window;
   at least two radiant energy sources disposed outside of said chamber and positioned adjacent to said window, said radiant energy sources having a central longitudinal axis that extends in a substantially perpendicular direction relative to said window;
   at least one reflector having a central axis and a first end, said reflector to direct radiant energy from at least one of said radiant energy sources out said first end toward said window; and
   a specular reflector surface at said first end of said reflector, said specular reflector surface including upper and lower regions, said upper region tapered to reflect radiant energy from said at least one radiant energy source out of said first end through said window and onto a surface of a substrate to be processed in said process chamber to radiate a limited area of said substrate surface.

18. The apparatus of claim 17 wherein said tapered region has a taper angle α, α₁ or β of approximately 1 to 89 degrees.

19. The apparatus of claim 17 wherein said radiant energy source includes a filament disposed within said lamp envelope and said filament is oriented substantially perpendicular to said central axis.

20. A thermal heating apparatus for heating a substrate, during rapid thermal processing of said substrate, comprising:
   a plurality of radiant energy sources;
   a plurality of light pipes associated with said radiant energy sources, said light pipes including a first end from which radiant energy from a radiant energy source can be directed toward a substrate;
   a specular reflector at said first end of each of said light pipes, said specular reflector including a tapered region to reflect radiant energy from a radiant energy source toward said substrate;
   a processing chamber in which said substrate may be disposed, said processing chamber including a window positioned between said radiant energy sources and said substrate when disposed in said processing chamber, such that said tapered region is adjacent to said window so radiant energy is reflected from said tapered region through said window into said chamber to radiate a surface of said substrate to be processed; and wherein portions of the radiated areas of adjacent radiant energy sources overlap, the intensities at said portions adding to provide a radiation intensity across said substrate surface which is dependent upon the intensity of said adjacent radiant energy sources.

21. An apparatus for rapid thermal processing of a substrate, comprising:

a process chamber having a window;

a plurality of radiant energy sources disposed outside of said chamber and positioned adjacent to said window, said radiant energy sources having a central longitudinal axis that extends in a substantially perpendicular direction relative to said window; and reflectors associated with said radiant energy sources to direct radiant energy through said window to radiate predetermined regions of a surface of a substrate to be processed in said chamber with a pattern of radiation intensity, said reflectors extending along a major portion of said longitudinal axis of said radiant energy sources, said reflectors including a tapered region at a first end adjacent to said window to reflect radiant energy from said radiant energy sources and direct it onto the substrate surface, and said radiant energy sources and said reflectors positioned so that a portion of a predetermined region radiated by one radiant energy source overlaps a portion of a predetermined region radiated by an adjacent radiant energy source to provide radiation intensity across the substrate surface that is dependent upon the intensity of adjacent radiant energy sources.

22. An apparatus for the rapid thermal processing of a substrate, comprising:

a process chamber having a window;

an assembly of radiant energy sources disposed outside of said chamber, said radiant energy sources having a central longitudinal axis that extends in a substantially perpendicular direction relative to said window and subsets of said radiant energy sources disposed at different radii of the assembly and each radiant energy source terminating in a common plane adjacent to said window; and reflectors associated with said radiant energy sources to direct radiant energy through said window to radiate predetermined regions of a surface of a substrate to be processed in said chamber with a pattern of radiation intensity, said reflectors extending along a major portion of said longitudinal axis of said radiant energy sources and a central axis of said reflectors extending in a substantially perpendicular direction relative to said window, said reflectors including a tapered region at a first end adjacent to said window to reflect radiant energy from said radiant energy sources and direct it toward the substrate surface, and said radiant energy sources and said reflectors positioned so that a portion of one of said predetermined regions radiated by one of said radiant energy sources overlaps a portion of a predetermined region radiated by an adjacent one of said radiant energy sources to provide a radiation intensity across the substrate surface that is dependent upon the intensity of adjacent radiant energy sources.

23. The apparatus of claim 22 wherein said reflectors have a first length and said tapered region comprises approximately 100 percent of said first length.

24. The apparatus of claim 22 wherein said tapered region diverges from a wall portion of said reflector which is parallel to the central axis thereof at a taper angle of approximately 1 to 89 degrees.

25. The apparatus of claim 24 where said taper angle is approximately 1 to 30 degrees.

26. The apparatus of claim 22 wherein said radiant energy sources include a lamp envelope which is at least partially disposed within said reflectors, said lamp envelope including a first end near a base portion of said lamp and a second end, said tapered region beginning opposite said second end of said lamp envelope.

27. The apparatus of claim 22 wherein said radiant energy sources include a lamp envelope which is disposed within said reflectors and said tapered region is opposite at least a portion of said lamp envelope.

28. The apparatus of claim 22 wherein said reflectors include a specular reflecting surface at said first end.

29. The apparatus of claim 22 wherein said reflectors include a flared specular reflector sleeve positioned within said reflectors at said first end.

30. An apparatus for the rapid thermal processing of a substrate, comprising:

a process chamber having a window;

an assembly of radiant energy sources disposed outside of said chamber, said radiant energy sources having a central longitudinal axis that extends in a substantially perpendicular direction relative to said window, subsets of said radiant energy sources disposed at different radii of the assembly, each radiant energy source terminating in a common plane adjacent to said window, and said radiant energy sources including a filament oriented substantially perpendicular to said longitudinal axis; and reflectors associated with said radiant energy sources to direct radiant energy through said window to radiate predetermined regions of a substrate in said chamber with a pattern of radiation intensity, said reflectors extending along a major portion of said longitudinal axis and a central axis of said reflectors extending in a substantially perpendicular direction relative to said window, said reflectors including a tapered region to reflect radiant energy from said radiant energy sources and direct it onto the substrate, and said radiant energy sources and said reflectors positioned so that a portion of one of said predetermined regions radiated by one of said radiant energy sources overlaps a portion of a predetermined region radiated by an adjacent one of said radiant energy sources to provide a radiation intensity across the substrate that is dependent upon the intensity of adjacent radiant energy sources.

31. An apparatus for the rapid thermal processing of a substrate, comprising:

a process chamber having a window;

an assembly of radiant energy sources disposed outside of said chamber, said radiant energy sources having a central longitudinal axis that extends in a substantially perpendicular direction relative to said window and subsets of said radiant energy sources disposed at different radii of the assembly and each radiant energy source terminating in a common plane adjacent to said window; and reflectors associated with said radiant energy sources to direct radiant energy through said window to radiate predetermined regions of a surface of a substrate to be processed in said chamber with a pattern of radiation intensity, said reflectors extending along a major portion of said longitudinal axis of said radiant energy sources and a central axis of said reflectors extending in a substantially perpendicular direction relative to said window, said reflectors having a first length and a tapered region of a first end adjacent to said window which comprises approximately 30 to 50 percent of said first length to reflect radiant energy from said radiant energy sources and direct it toward the substrate surface, and said radiant energy sources and said reflectors positioned so that a portion of one of said predetermined regions radiated by one of said radiant energy sources overlaps a portion of a predetermined region radiated by an adjacent one of said radiant energy sources to provide a radiation intensity across the substrate surface that is dependent upon the intensity of adjacent radiant energy sources.

32. The apparatus of claim 31 wherein said tapered region comprises approximately 30 percent of said first length.

33. An apparatus for the rapid thermal processing of a substrate, comprising:

a plurality of radiant energy sources disposed outside of a process chamber and positioned adjacent to a window thereof, said radiant energy sources having a central longitudinal axis that extends in a substantially perpendicular direction relative to said window; and reflectors having a tapered region to guide a substantial quantity of radiant energy from said radiation sources onto specific regions of a substrate surface to be processed in said chamber, said reflectors extending along at least a major portion of said longitudinal axis of said radiant energy sources, and said radiant energy sources and said reflectors positioned so that a specific region radiated by one radiant energy source overlaps a specific region radiated by another radiant energy source to provide a pattern of radiation intensity across the substrate surface that is dependent upon the intensity of each of said radiant energy sources.

* * * * *